United States Patent
Gomes et al.

(10) Patent No.: US 10,740,213 B1
(45) Date of Patent: Aug. 11, 2020

(54) COUNTER OVERFLOW MANAGEMENT FOR ASYNCHRONOUS DATA MOVER FACILITY

(71) Applicant: International Business Machines Corporation, Armonk, NY (US)

(72) Inventors: Louis P. Gomes, Poughkeepsie, NY (US); Anthony Thomas Sofia, Hopewell-Junction, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/407,355

(22) Filed: May 9, 2019

(51) Int. Cl.
| | |
|---|---|
| G06F 11/34 | (2006.01) |
| H03K 21/08 | (2006.01) |
| G06F 11/32 | (2006.01) |
| G06F 11/30 | (2006.01) |

(52) U.S. Cl.
CPC ........ G06F 11/349 (2013.01); G06F 11/3041 (2013.01); G06F 11/324 (2013.01); H03K 21/08 (2013.01)

(58) Field of Classification Search
CPC .................................................. G06F 11/349
See application file for complete search history.

(56) References Cited

U.S. PATENT DOCUMENTS

| | | | |
|---|---|---|---|
| 7,174,274 B2 | 2/2007 | Carlson et al. | |
| 9,122,573 B2 | 9/2015 | Driever et al. | |
| 9,304,890 B2 * | 4/2016 | Peck | ................... G06F 11/3476 |

* cited by examiner

Primary Examiner — Hai L Nguyen
(74) Attorney, Agent, or Firm — Cantor Colburn LLP; Teddi Maranzano (57) ABSTRACT

Techniques for counter overflow management for an asynchronous data mover facility are described herein. An aspect includes tracking operations of an asynchronous data mover facility of a computer system using a plurality of internal counters. Another aspect includes, based on receiving a measurement query, determining a plurality of display counters, each of the plurality of display counters corresponding to a respective internal counter of the plurality of internal counters. Another aspect includes generating a measurement block based on the plurality of display counters. Another aspect includes setting a counter overflow flag corresponding to a display counter of the plurality of display counters in a counter overflow flags field of the measurement block. Yet another aspect includes sending the measurement block in response to the measurement query.

17 Claims, 6 Drawing Sheets

COUNTER OVERFLOW MANAGEMENT FOR ASYNCHRONOUS DATA MOVER FACILITY

BACKGROUND

The present techniques relate to computer systems. More specifically, the techniques relate to counter overflow management for an asynchronous data mover facility in a computer system.

Technologies behind solid-state nonvolatile random access memory (RAM), which may be collectively referred to as storage class memory (SCM), are rapidly maturing. As a result, SCM may appear in enterprise-class mainframe servers. For example, SCM may be used as a physical replacement for mechanical-arm spinning disks, with the SCM interface being similar to that of the more traditional direct access storage devices (DASDs). A computing environment may include main storage (a.k.a., main memory), as well as auxiliary storage. Main storage is storage accessible to a processor which is randomly addressable by, for instance, an absolute address. Main storage is considered fast access storage compared to auxiliary storage, such as DASD or SCM. SCM, which may be an external storage space outside of classical main storage, may provide faster access than DASD. SCM may be implemented as groups of solid state devices connected to a computing system via several input/output (I/O) adapters, which are used to map technology of an I/O device to the memory bus of the central processing unit(s).

SUMMARY

According to an embodiment described herein, a system can include a processor to track operations of an asynchronous data mover facility of a computer system using a plurality of internal counters. The processor can also, based on receiving a measurement query, determine a plurality of display counters, each of the plurality of display counters corresponding to a respective internal counter of the plurality of internal counters. The processor can also generate a measurement block based on the plurality of display counters. The processor can also set a counter overflow flag corresponding to a display counter of the plurality of display counters in a counter overflow flags field of the measurement block. The processor can also send the measurement block in response to the measurement query.

According to another embodiment described herein, a method can include tracking operations of an asynchronous data mover facility of a computer system using a plurality of internal counters. The method can also include, based on receiving a measurement query, determining a plurality of display counters, each of the plurality of display counters corresponding to a respective internal counter of the plurality of internal counters. The method can also include generating a measurement block based on the plurality of display counters. The method can also include setting a counter overflow flag corresponding to a display counter of the plurality of display counters in a counter overflow flags field of the measurement block. The method can also include sending the measurement block in response to the measurement query.

According to another embodiment described herein, a computer program product can include a computer readable storage medium having program instructions embodied therewith, the program instructions executable by a processing device to cause the processing device to perform a method including tracking operations of an asynchronous data mover facility of a computer system using a plurality of internal counters. The method can also include, based on receiving a measurement query, determining a plurality of display counters, each of the plurality of display counters corresponding to a respective internal counter of the plurality of internal counters. The method can also include generating a measurement block based on the plurality of display counters. The method can also include setting a counter overflow flag corresponding to a display counter of the plurality of display counters in a counter overflow flags field of the measurement block. The method can also include sending the measurement block in response to the measurement query.

DETAILED DESCRIPTION

One or more embodiments of the present invention provide counter overflow management for an asynchronous data mover facility in a computer system. Asynchronous data movement operations in a computer system that includes SCM may be performed by an enhanced asynchronous data mover (EADM) facility. The EADM facility may include asynchronous execution of a central processing unit (CPU) deflate compression instruction to perform compress and decompress operations. EADM measurement data (e.g., characteristics of asynchronous execution of a CPU deflate compression instruction that performs compression and decompression operations) may be measured using a plurality of counters, and the resulting counter data may be provided to a resource measurement facility (RMF) program of a computer system via an EADM measurement block that is sent in response to a channel subsystem call (CHSC) command from the RMF program. However, the counter data may require more space than is available in the EADM measurement block. For example, the input and output data areas of an EADM compression or decompression operation may be relatively large, such that the accumulated length of input or output data counter for EADM compression operations may grow relatively quickly as compared to other EADM compression measurement data counters values. Therefore, counter overflow management may be performed to provide accurate counter values to the RMF program within the space available in the EADM measurement block without losing the counter values due to counter overflow.

An input/output processor (IOP) of a computer system may maintain internal counters that track EADM operations. The internal counters may be larger than the amount of space that is available in the EADM measurement block. The IOP may determine display counters that are smaller than the internal counters for inclusion in the EADM measurement block. Each display counter may have a respective overflow flag in the EADM measurement block. In some embodiments of counter overflow management, at least four EADM data counters may be maintained by the IOP: an EADM-Compress-Operation-Input-Data-Count, an EADM-Compress-Operation-Output-Data-Count, an EADM-Decompress-Operation-Input-Data-Count, and an EADM-Decompress-Operation-Output-Data-Count. These counter values are provided from the IOP to the RMF program via the EADM measurement block. For each counter, the EADM measurement block may include a respective counter overflow flag in a counter overflow flags field. In some embodiments, each counter overflow flag may be one bit. The counter overflow flags field tracks and reports counter overflow events for the various EADM counters.

The RMF program may set an initial measurement query frequency for sending CHSC commands to the IOP based on, for example, knowledge of compression throughput. The IOP uses the larger internal counters to maintain proper counter precision, and converts each EADM counter value into a corresponding smaller display counter to conserve space in the EADM measurement block that is sent in response to the CHSC command that is received from the RMF program. If a counter overflow occurs, the IOP sets the counter overflow flag corresponding to the output counter that has overflowed in the EADM measurement block. If a counter overflow flag is set in the EADM measurement block, the RMF program may determine an actual counter value for the corresponding display counter by adding an overflow value to the display counter value to compensate for the counter overflow. The RMF program may also increase the measurement query frequency based on, for example, a number of overflowed counters, in order to reduce future counter overflow.

Figure 1:
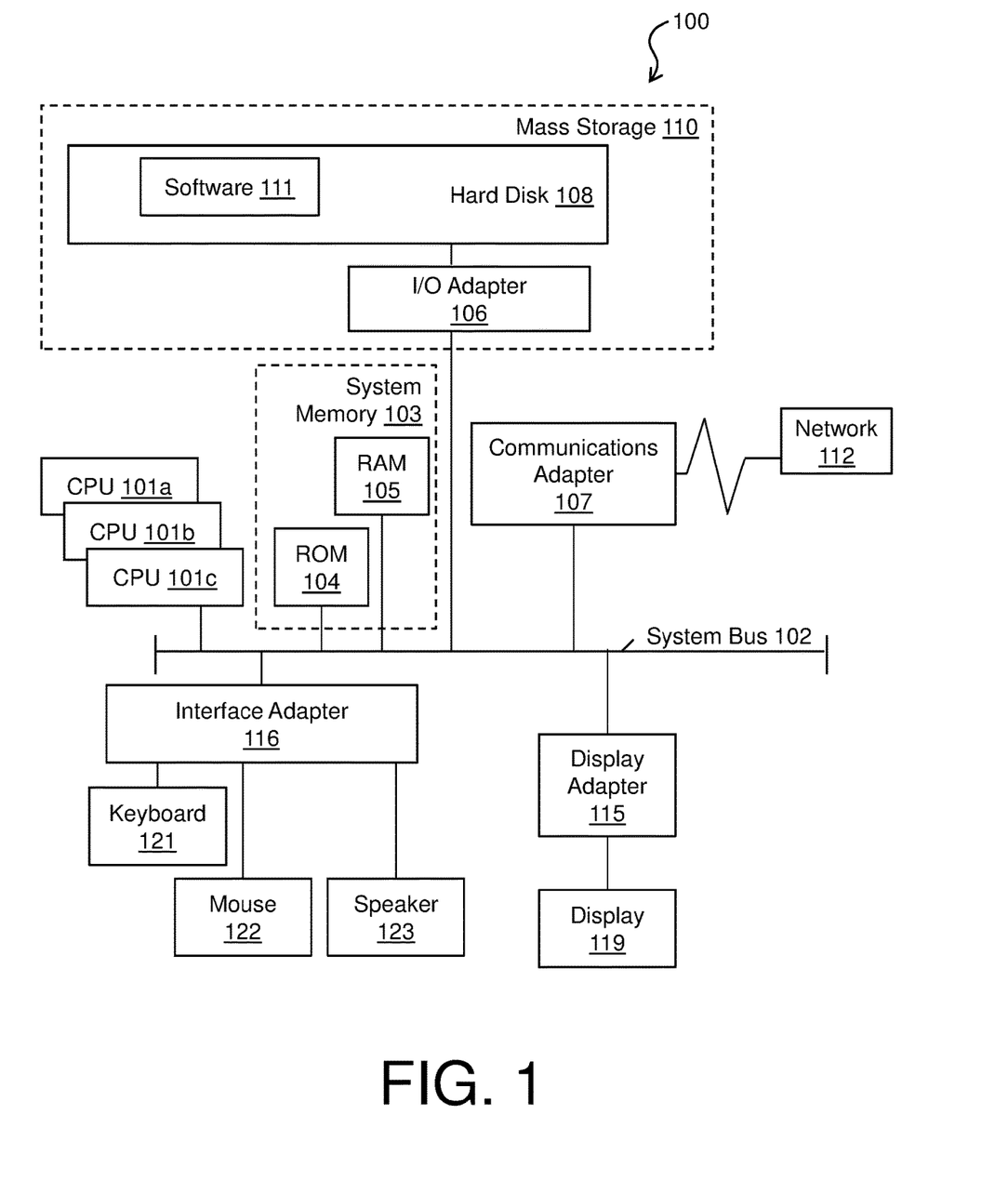
FIG. 1 is a block diagram of an example computer system for use in conjunction with counter overflow management for an asynchronous data mover facility.

Turning now to FIG. 1, a computer system 100 is generally shown in accordance with an embodiment. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units, i.e., CPUs 101a, 101b, 101c, etc. (collectively or generically referred to as processor 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system, such as the z/OS or AIX operating system from IBM Corporation, to coordinate the functions of the various components shown in FIG. 1.

Additional input/output devices are shown as connected to the system bus 102 via a display adapter 115 and an interface adapter 116 and. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by a display adapter 115, which may include a graphics controller to improve the performance of graphics intensive applications and a video controller. A keyboard 121, a mouse 122, a speaker 123, etc. can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
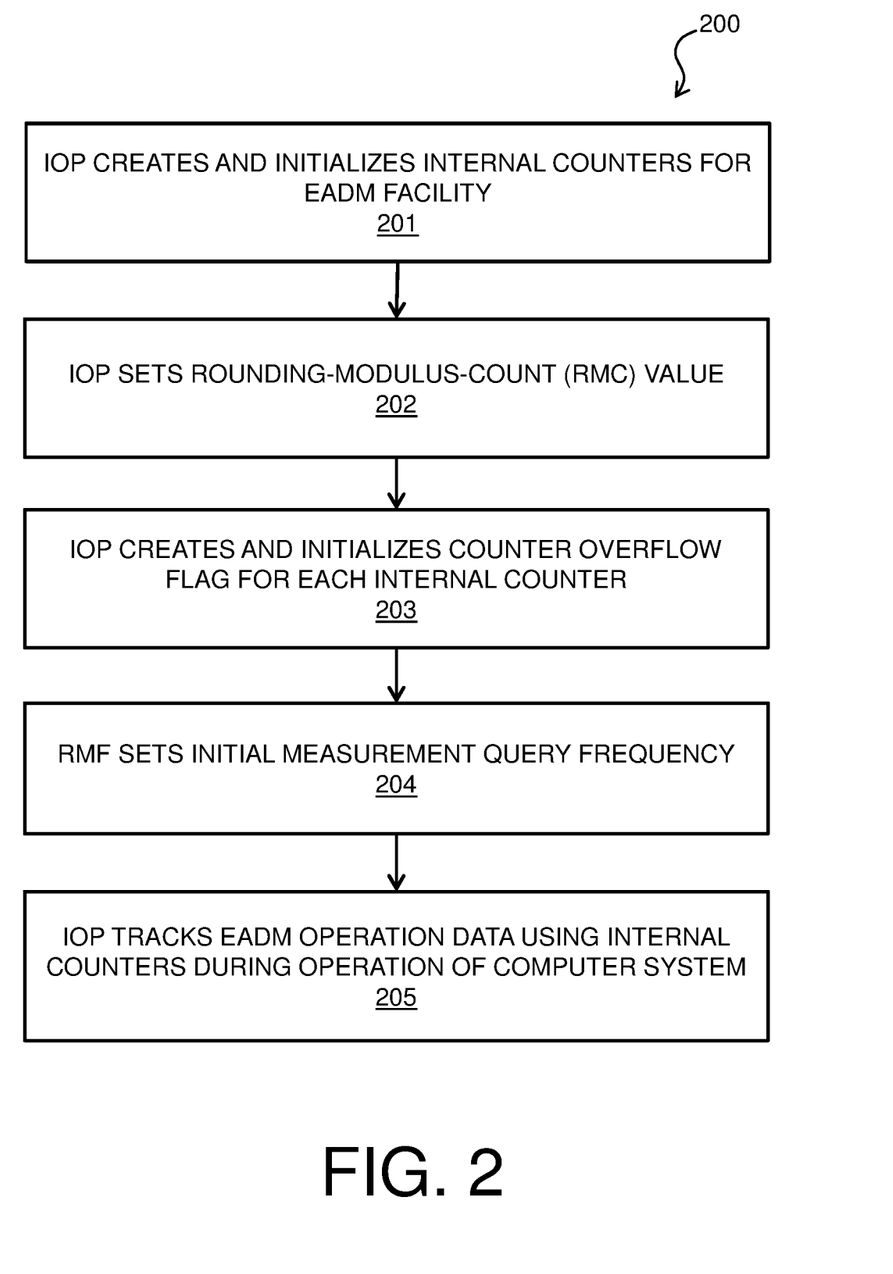
FIG. 2 is a process flow diagram of a method for counter overflow management for an asynchronous data mover facility in accordance with one or more embodiments of the present invention.

FIG. 2 is a process flow diagram of a method 200 for counter overflow management for an asynchronous data mover facility in accordance with one or more embodiments of the present invention. Method 200 of FIG. 2 may be implemented in conjunction with any appropriate computer system, such as computer system 100 of FIG. 1. In block 201 of method 200, the IOP of a computer system creates and initializes a plurality of internal counters to track the operations of an EADM facility of the computer system. The EADM facility performs asynchronous data movement operations in conjunction with SCM in the computer system, and may perform compression and decompression operations. The internal counters may be created in block 201 by the IOP at startup of the computer system in some embodiments. Each internal counter may have any appropriate size in various embodiments; in some embodiments, each internal counter may be a 64-bit counter. The internal counters may be initialized with zeroes prior to any EADM operation being performed in the computer system in some embodiments of block 201.

In block 202, the IOP sets a rounding-modulus-count (RMC) value. The RMC value is used to perform rounding operations on the relatively large internal counters, and report the higher order bits of the relatively large internal counters in the display counters. In various embodiments, the RMC value may be set by the IOP based on calculations regarding historical EADM data, the sizes of the internal and display counters, and/or test results. The RMC value may be set in block 202 by the IOP at startup of the computer system in some embodiments. In block 203, the IOP creates a respective counter overflow flag for each of the counters that were created and initialized in block 201. The counter overflow flags may each be a single bit in some embodiments. The counter overflow flags may each be initialized to zero in some embodiments of block 203.

In block 204 of method 200, the RMF program of the computer system sets an initial measurement query frequency. The measurement query frequency determines how often the RMF program requests the EADM measurement block from the IOP via, for example, a CHSC command. The initial measurement query frequency may be any appropriate frequency, and may be determined based on historical EADM data in some embodiments. For example, the initial measurement query frequency may be set based on maximum compression throughput, a frequency of the execution of EADM compression operations, and/or a size of EADM input and output data. The initial measurement query frequency may be set by the RMF program at startup of the computers system in some embodiments of method 200. In some embodiments, the measurement query may be sent from the RMF to the IOP approximately once an hour.

In block 205, during operation of the computer system, the EADM facility performs asynchronous data movement operations, and the IOP accumulates EADM data in the plurality of internal counters that were initialized in block 201 based on the operations of the EADM facility. Block 205 of method 200 may be performed throughout operation of the computer system. As EADM compression operations are executed in block 205, the input and output data area lengths of the EADM facility are accumulated in the internal counters that were created and initialized in block 201. Use of the relatively large internal counters to track the EADM operations may maintain rounding precision and preserve high order bits.

The process flow diagram of FIG. 2 is not intended to indicate that the operations of the method 200 are to be executed in any particular order, or that all of the operations of the method 200 are to be included in every case. Additionally, the method 200 can include any suitable number of additional operations.

Figure 3:
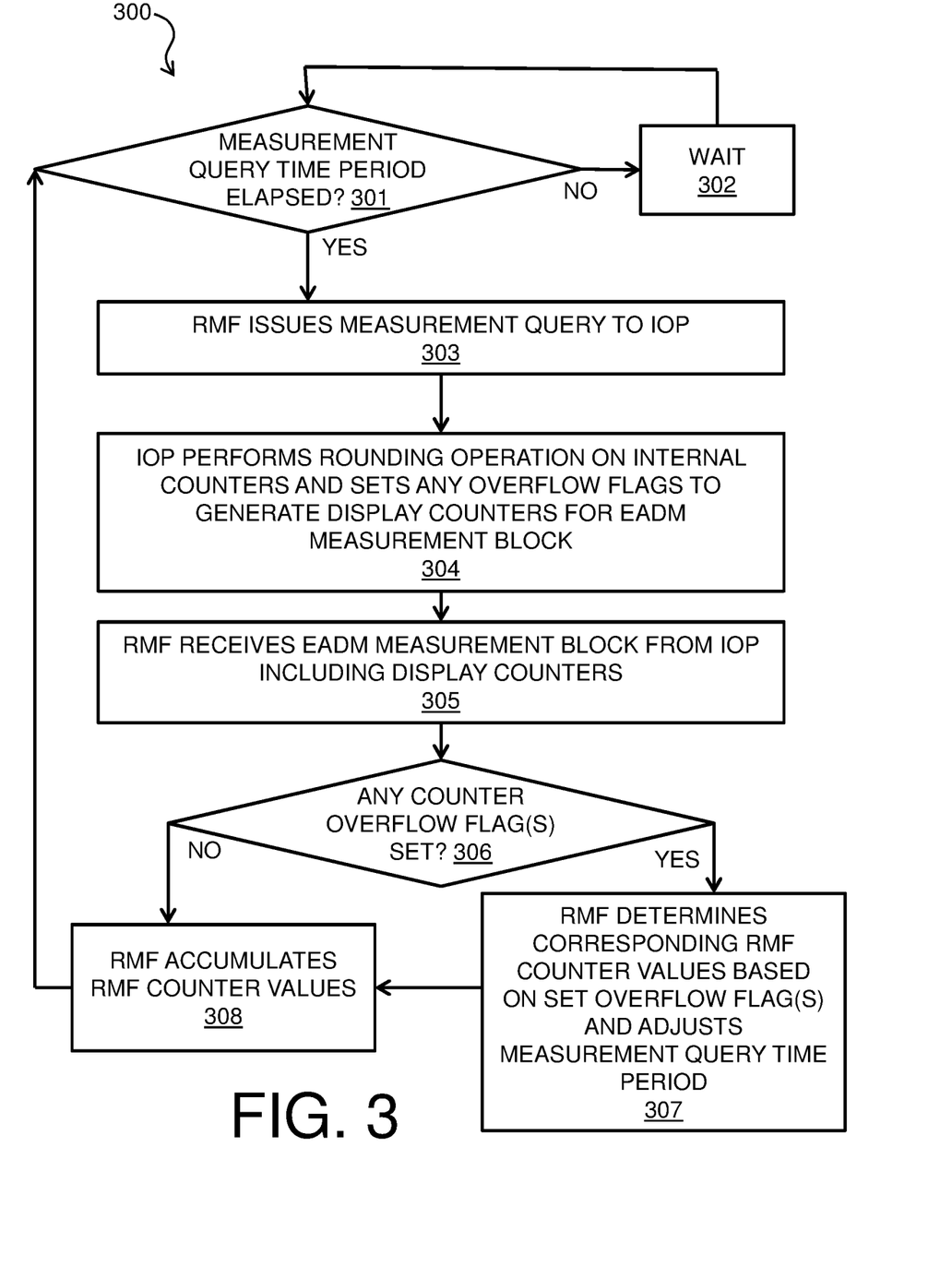
FIG. 3 is a process flow diagram of another method for counter overflow management for an asynchronous data mover facility in accordance with one or more embodiments of the present invention.

FIG. 3 is a process flow diagram of another method 300 for counter overflow management for asynchronous data mover facility in accordance with one or more embodiments of the present invention. Method 300 of FIG. 3 may be implemented in conjunction with any appropriate computer system, such as computer system 100 of FIG. 1. Method 300 may be triggered based on the measurement query frequency that was initially set in block 204 of FIG. 2, and may occur at any time during the execution of block 205 of method 200 of FIG. 2. In block 301 of method 300, it is determined by the RMF program whether the measurement query time period, which is based on the measurement query frequency, has elapsed. If it is determined in block 301 that the measurement query time period has not elapsed, flow proceeds to block 302, in which the RMF program waits, and then flow returns back to block 301 from block 302. When it is determined in block 301 that the measurement query time period has elapsed, flow proceeds from block 301 to block 303. In block 303, the RMF program issues the measurement query to the IOP. The measurement query may be a CHSC command in some embodiments.

In block 304, the IOP performs a rounding operation on each internal counter to determine a corresponding display counter, and determines whether to set a corresponding overflow flag for each display counter based on the rounding operation. The display counters and corresponding overflow flags are included in the EADM measurement block. The display counters may have any appropriate size in various embodiments; the display counters may be smaller than the internal counters, and may be 32-bit counters in some embodiments. In some embodiments of block 304, the IOP performs a rounding operation on each internal counter using the RMC value that was set in block 202 of method 200 of FIG. 2, and stores the result in a temporary staging counter in order to determine the value of the display counter to include in the EADM measurement block. This produces a display counter value that is a multiple of the RMC value. If any counter overflow occurs, the IOP may set the counter overflow flag in the overflow flags field of the EADM measurement block that corresponds to the internal counter that overflowed to one in block 304. Block 304 is discussed in further detail below with respect to FIG. 5.

In block 305, the EADM measurement block is sent from the IOP to the RMF program. An example EADM measurement block is discussed in further detail below with respect to FIG. 4. In block 306, the RMF program determines whether any of the overflow flags are set in the overflow flags field of the EADM measurement block. If it is determined in block 306 that no overflow flags are set in the EADM measurement block, flow proceeds from block 306 to block 308. If it is determined in block 306 that one or more overflow flags are set in the EADM measurement block, flow proceeds from block 306 to block 307. In block 307, the RMF program determines an RMF counter value corresponding to the set overflow flag and corresponding display counter to compensate for the counter overflow by adding an overflow value to the display counter value. The RMF program may also increase the measurement query frequency based on a number of set overflow flags in the EADM measurement block. For example, if one or more of the overflow flags are set, the RMF program may shorten the measurement query time period in block 307 to avoid future counter overflow. The adjustment may be made based on a number of overflow flags that are set in the EADM measurement block in some embodiments. Flow then proceeds from block 307 to block 308. In block 308, the RMF program accumulates RMF counter values based on the display counters in the EADM measurement block for display counters. Flow then proceeds from block 308 back to block 301, and the adjusted measurement query frequency may be used in block 301. Method 300 may be repeated throughout the operation of the computer system.

The process flow diagram of FIG. 3 is not intended to indicate that the operations of the method 300 are to be executed in any particular order, or that all of the operations of the method 300 are to be included in every case. Additionally, the method 300 can include any suitable number of additional operations.

Figure 4:
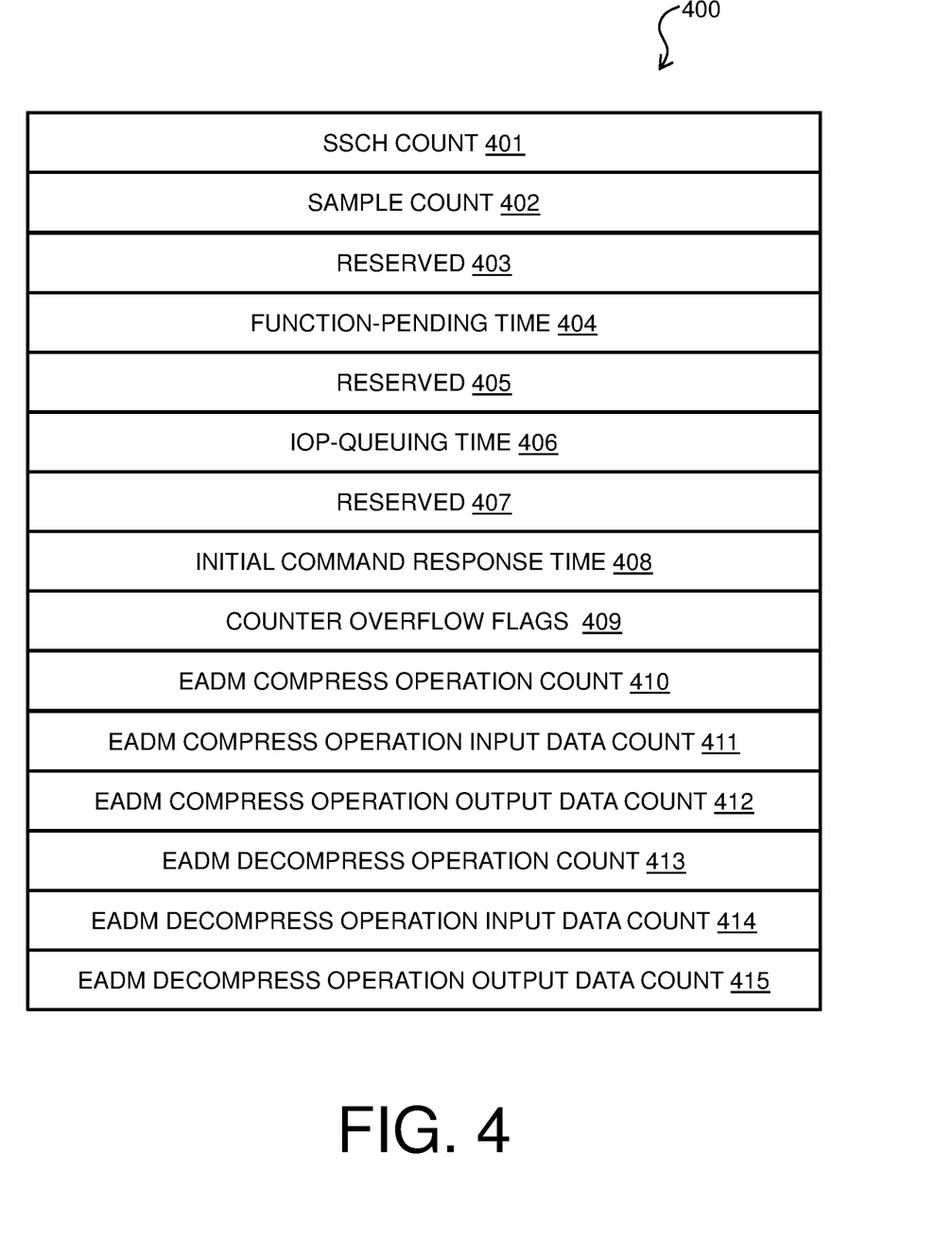
FIG. 4 is a block diagram of an enhanced asynchronous data mover (EADM) measurement block in accordance with one or more embodiments of the present invention.

FIG. 4 is a block diagram of an EADM measurement block 400 in accordance with one or more embodiments of the present invention. Embodiments of an EADM measurement block 400 may be generated and sent by the IOP of a computer system in blocks 304-305 of method 300 of FIG. 3. The EADM measurement block 400 includes start sub-channel (SSCH) count 401, sample count 402, reserved field 403, function-pending time 404, reserved field 405, IOP queuing time 406, reserved field 407, and initial command response time 408. The EADM measurement block further includes counter overflow flags field 409. The counter overflow flags field 409 may include a counter overflow flag for each of a plurality of counters in the EADM measurement block 400. In some embodiments, the counter overflow flags field 409 may include a respective 1-bit flag for each counter in the EADM measurement block 400. A counter overflow flag corresponding to a counter of the plurality of counters may be set by the IOP in block 304 of FIG. 3.

A plurality of display counters 410-415 in the EADM measurement block 400 may include EADM compress operation count 410, EADM-Compress-Operation-Input-Data-Count 411, EADM-Compress-Operation-Output-Data-Count 412, EADM decompress operation count 413, EADM-Decompress-Operation-Input-Data-Count 414, and EADM-Decompress-Operation-Output-Data-Count 415. For each of the display counters 410-415, the EADM measurement block 400 may include a respective counter overflow flag in counter overflow flags field 409. In some embodiments, each of display counters 410-415 may be 32 bits. Each of display counters 410-415 may be determined by the IOP based on a rounding operation in block 304 of method 300 of FIG. 3. Internal counters corresponding to each of display counters 410-415 may be created and initialized in block 201 of method 200 of FIG. 2 and maintained in block 205 of method 200 of FIG. 2.

FIG. 4 is shown for illustrative purposes only. For example, an EADM measurement block such as EADM measurement block 400 may have any appropriate fewer or additional fields not illustrated in FIG. 4, and the fields of an EADM measurement block may be in any appropriate order within the EADM measurement block. Further, the various fields of an EADM measurement block such as is shown in FIG. 4 may each be any appropriate size.

Figure 5:
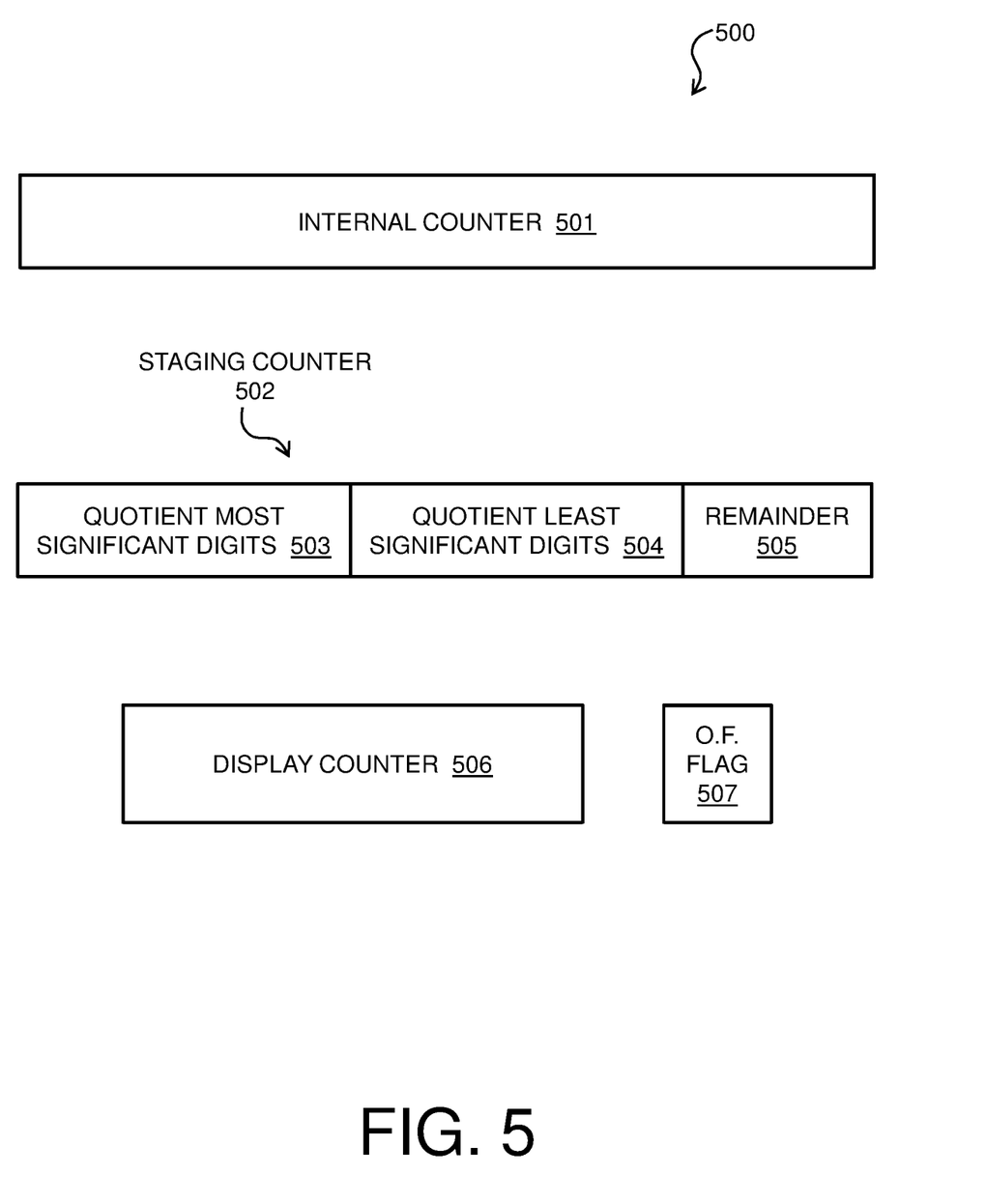
FIG. 5 is a block diagram of a counter system for an asynchronous data mover facility in accordance with one or more embodiments of the present invention.

FIG. 5 is a block diagram of a counter system 500 for an asynchronous data mover facility in accordance with one or more embodiments of the present invention. Internal counter 501 is maintained by the IOP, and display counter 506 is determined by the IOP in block 304 of method 300 of FIG. 3 based on the internal counter 501 for inclusion in the EADM measurement block 400 of FIG. 4. The internal counter 501 and display counter 506 may both correspond to any of display counters 410-415 of EADM measurement block 400 of FIG. 4. Internal counter 501 may include a larger number of bits than display counter 506; for example, internal counter 501 may be a 64-bit counter in some embodiments, and display counter 506 may be a 32-bit counter in some embodiments.

In order to generate display counter 506, the IOP may perform a division with remainder arithmetic operation on the internal counter 501 using the RMC value that was set by the IOP in block 202 of method 200 of FIG. 2 (e.g., the value of the internal counter 501 is divided by the RMC value) and stores the quotient in a temporary staging counter 502. The staging counter 502 may be the same size as the internal counter 501 in some embodiments. The staging counter 502 holds a quotient most significant digits field 503, a quotient least significant digits field 504, and remainder 505, which are generated based on the RMC value. If the remainder 505 is greater than or equal to 50 percent or more than the RMC value, the quotient least significant digits field 504 in staging counter 502 is incremented by one. In some embodiments, the RMC value may be a power of 2. After rounding based on remainder 505, the quotient least significant digits field 504 is copied from the staging counter 502 to the display counter 506 in the EADM measurement block 400 by the IOP. The rounding operation produces a smaller output counter value that is a multiple of the pre-selected RMC value for inclusion in the display counter 506. For example, if the RMC value is 4, then the display counter 506 in the EADM measurement block 400 is a multiple of 4, because a 2-bit remainder 505 can hold a maximum value of 3. If a 64-bit internal counter 501 in the IOP contains a value of 7, then the display counter 506 may be 2. That is, 7 divided by an RMC value of 4 results in a quotient least significant digits field 504 of 1, and a remainder 505 of 3 which is rounded to 1. If a 64-bit internal counter 501 contains a value of 5, then the display counter 506 may be 1. That is, 5 divided by an RMC value of 4 results in a quotient least significant digits field 504 of 1, and a remainder 505 of 1 which is rounded to 0. The larger internal counter 501 may reduce rounding error and maintain a relatively high counter precision that is at least as large as the display counter 506 in the EADM measurement block 400. The data lengths of each compression operation are accumulated in the respective internal counters 501 instead of rounding after each compression operation. Counter overflow for the particular internal counter 501 is indicated using the counter overflow flag 507, which is included in counter overflow flags field 409 of EADM measurement block 400 of FIG. 4. The counter overflow flag 507 may be set based on quotient most significant digits field 503 in some embodiments. The counter overflow flag 507 being set may indicate to the RMF program that an overflow value needs to be added to the value of the display counter 506 to determine the actual counter value.

FIG. 5 is shown for illustrative purposes only. The various counters of a counter system such as counter system 500 may have any appropriate fewer or additional fields not illustrated in FIG. 5, and each field may be any appropriate size. Further, any appropriate additional counters, each having any appropriate size, may be maintained in a counter system 500.

Figure 6:
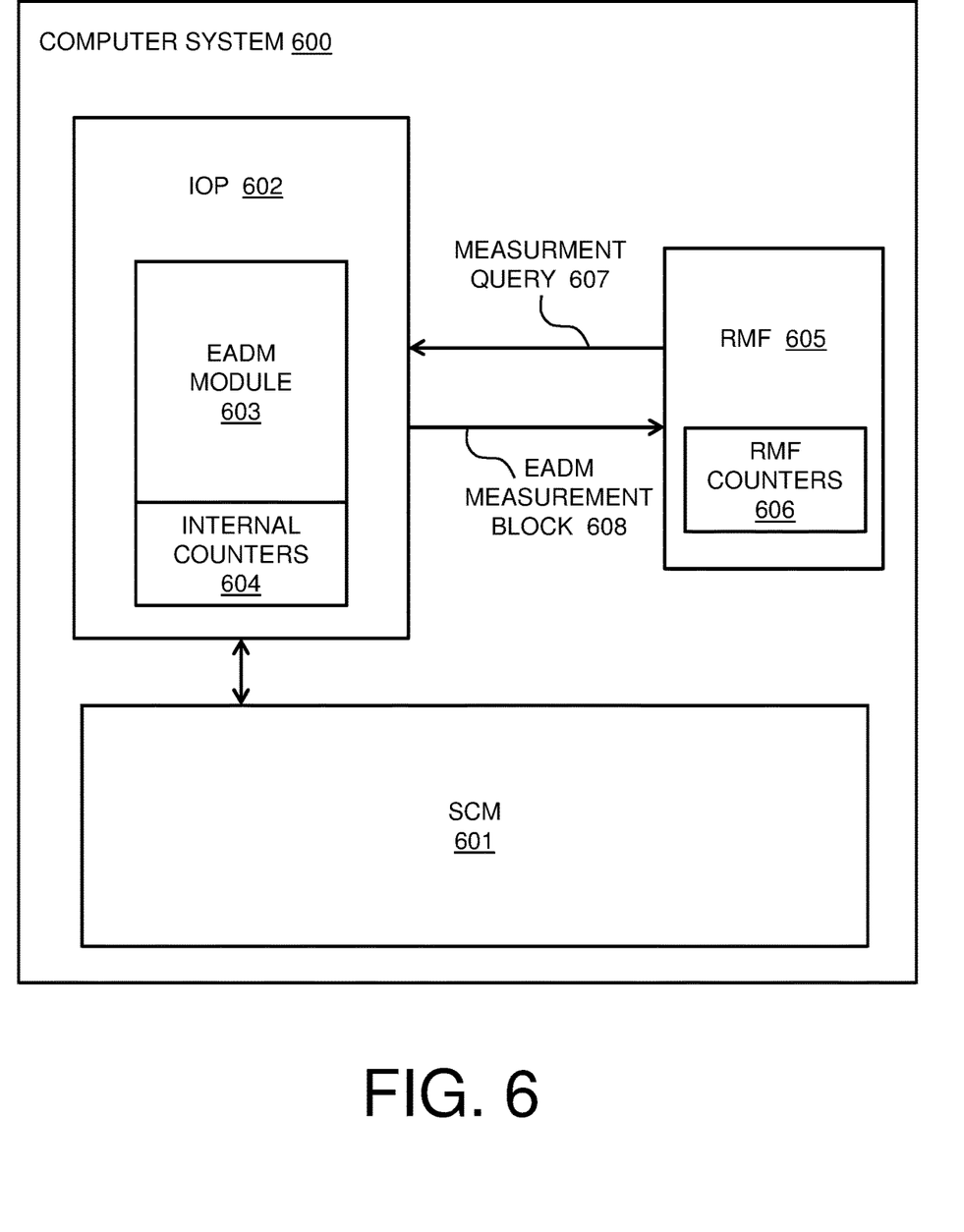
FIG. 6 is a block diagram of a system for counter overflow management for an asynchronous data mover facility in accordance with one or more embodiments of the present invention.

FIG. 6 is a block diagram of a computer system 600 for counter overflow management for an asynchronous data mover facility in accordance with one or more embodiments of the present invention. Computer system 600 of FIG. 6 may include any elements discussed in conjunction with computer system 100 of FIG. 1. Computer system 600 of FIG. 6 may implement method 200 of FIG. 2 and method 300 of FIG. 3. In computer system 600, IOP 602 manages data operations in SCM 601. EADM module 603 in IOP 602 performs asynchronous data movement operations in SCM 601. At startup of the computer system 600, the IOP 602 may create and initialize internal counters 604 to track the operations of EADM module 603. The internal counters 604 may each be 64-bit counters in some embodiments. During operation of the computer system 600, data regarding the operations of EADM module 603 is accumulated in internal counters 604. Internal counters 604 may each correspond to an internal counter 501 as shown in FIG. 5, and may each have a respective display counter of display counters 410-415 as shown in EADM measurement block 400 of FIG. 4.

The RMF 605 issues measurement query 607 to IOP 602 based on a measurement query frequency. The measurement query 607 may be a CHSC command in some embodiments. The IOP 602 generates display counters, such as display counters 410-415 of FIG. 4, for the EADM measurement block 608 based on internal counters 604 as discussed above with respect to FIG. 5, and sends the EADM measurement block 608 to the RMF 605 based on receiving the measurement query 607. The display counters in the EADM measurement block 608 may each correspond to a display counter 506 of FIG. 5. The EADM measurement block 608 may correspond to EADM measurement block 400 of FIG. 4. The RMF 605 determines RMF counters 606 based on the display counters in the EADM measurement block 608 as discussed above with respect to blocks 306-308 of method 300 of FIG. 3, and may adjust the measurement query frequency as appropriate based on the counter overflow flags field 409 in the EADM measurement block 608.

It is to be understood that the block diagram of FIG. 6 is not intended to indicate that the computer system 600 is to include all of the components shown in FIG. 6. Rather, the computer system 600 can include any appropriate fewer or additional components not illustrated in FIG. 6 (e.g., additional memory components, embedded controllers, functional blocks, connections between functional blocks, modules, inputs, outputs, etc.). Further, the embodiments described herein with respect to computer system 600 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising a resource management facility (RMF) and an input/output processor (IOP) configured to:
    track, by the IOP, operations of an asynchronous data mover facility of the computer system using a plurality of internal counters;
    based on receiving a measurement query from the RMF by the IOP, determine, by the IOP, a plurality of display counters, each of the plurality of display counters corresponding to a respective internal counter of the plurality of internal counters;
    generate, by the IOP, a measurement block based on the plurality of display counters;
    set, by the IOP, a counter overflow flag corresponding to a display counter of the plurality of display counters in a counter overflow flags field of the measurement block; and
    send the measurement block from the IOP to the RMF in response to the measurement query.

2. The computer system of claim 1, wherein the measurement query is periodically sent by the RMF to the IOP based on a measurement query frequency, and wherein the RMF is configured to:
    based on the counter overflow flag being set, increase the measurement query frequency.

3. The computer system of claim 1, the RMF configured to:
    receive the measurement block;
    determine that the counter overflow flag is set; and
    based on determining that the counter overflow flag is set, add an overflow value to a value of the display counter.

4. The computer system of claim 1, the IOP configured to:
    set a rounding-modulus-count (RMC) value;
    wherein determining the plurality of display counters comprises, for each of the plurality of internal counters, performing a rounding operation based on the RMC value, and wherein the RMC value is a power of 2.

5. The computer system of claim 1, wherein the plurality of display counters comprises an enhanced asynchronous data mover (EADM)-Compress-Operation-Input-Data-Count, an EADM-Compress-Operation-Output-Data-Count, an EADM-Decompress-Operation-Input-Data-Count, and an EADM-Decompress-Operation-Output-Data-Count.

6. The computer system of claim 1, wherein the internal counter is a 64-bit counter, and the display counter is a 32-bit counter.

7. A computer-implemented method, comprising:
    tracking, by an input/output processor (IOP) of a computer system, operations of an asynchronous data mover facility of the computer system using a plurality of internal counters;
    based on receiving a measurement query from a resource management facility (RMF) of the computer system by the IOP, determining, by the IOP, a plurality of display counters, each of the plurality of display counters corresponding to a respective internal counter of the plurality of internal counters;
generating, by the IOP, a measurement block based on the plurality of display counters;
setting, by the IOP, a counter overflow flag corresponding to a display counter of the plurality of display counters in a counter overflow flags field of the measurement block; and
sending the measurement block from the IOP to the RMF in response to the measurement query.

8. The computer-implemented method of claim 7, wherein the measurement query is periodically sent by the RMF to the IOP based on a measurement query frequency, and the method comprising:
based on the counter overflow flag being set, increasing, by the RMF, the measurement query frequency.

9. The computer-implemented method of claim 7, comprising:
receiving, by the RMF, the measurement block;
determining that the counter overflow flag is set; and
based on determining that the counter overflow flag is set, adding an overflow value to a value of the display counter.

10. The computer-implemented method of claim 7, comprising:
setting, by the IOP, a rounding-modulus-count (RMC) value;
wherein determining the plurality of display counters comprises, for each of the plurality of internal counters, performing a rounding operation based on the RMC value, and wherein the RMC value is a power of 2.

11. The computer-implemented method of claim 7, wherein the plurality of display counters comprises an enhanced asynchronous data mover (EADM)-Compress-Operation-Input-Data-Count, an EADM-Compress-Operation-Output-Data-Count, an EADM-Decompress-Operation-Input-Data-Count, and an EADM-Decompress-Operation-Output-Data-Count.

12. The computer-implemented method of claim 7, wherein the internal counter is a 64-bit counter, and the display counter is a 32-bit counter.

13. A computer program product comprising:
a computer readable storage medium having program instructions embodied therewith, the program instructions executable by a processing device to cause the processing device to perform a method comprising:
tracking, by an input/output processor (IOP) of a computer system, operations of an asynchronous data mover facility of the computer system using a plurality of internal counters;
based on receiving a measurement query from a resource management facility (RMF) of the computer system by the IOP, determining, by the IOP, a plurality of display counters, each of the plurality of display counters corresponding to a respective internal counter of the plurality of internal counters;
generating, by the IOP, a measurement block based on the plurality of display counters;
setting, by the IOP, a counter overflow flag corresponding to a display counter of the plurality of display counters in a counter overflow flags field of the measurement block; and
sending the measurement block from the IOP to the RMF in response to the measurement query.

14. The computer program product of claim 13, wherein the measurement query is periodically sent by the RMF to the IOP based on a measurement query frequency, and wherein the method comprises:
based on the counter overflow flag being set, increasing, by the RMF, the measurement query frequency.

15. The computer program product of claim 13, the method comprising:
receiving, by the RMF, the measurement block;
determining that the counter overflow flag is set; and
based on determining that the counter overflow flag is set, adding an overflow value to a value of the display counter.

16. The computer program product of claim 13, the method comprising:
setting, by the IOP, a rounding-modulus-count (RMC) value;
wherein determining the plurality of display counters comprises, for each of the plurality of internal counters, performing a rounding operation based on the RMC value, and wherein the RMC value is a power of 2.

17. The computer program product of claim 13, wherein the plurality of display counters comprises an enhanced asynchronous data mover (EADM)-Compress-Operation-Input-Data-Count, an EADM-Compress-Operation-Output-Data-Count, an EADM-Decompress-Operation-Input-Data-Count, and an EADM-Decompress-Operation-Output-Data-Count.

* * * * *